United States Patent
Hoshino et al.

(10) Patent No.: US 9,545,028 B2
(45) Date of Patent: Jan. 10, 2017

(54) ELECTRONIC CIRCUIT UNIT AND COMMUNICATION DEVICE

(71) Applicant: FUJITSU LIMITED, Kawasaki-shi, Kanagawa (JP)

(72) Inventors: Yoshinori Hoshino, Kawasaki (JP); Kazuya Fuke, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 299 days.

(21) Appl. No.: 14/064,854

(22) Filed: Oct. 28, 2013

(65) Prior Publication Data
US 2014/0118972 A1   May 1, 2014

(30) Foreign Application Priority Data
Oct. 31, 2012  (JP) .................. 2012-240260

(51) Int. Cl.
  H05K 5/00  (2006.01)
  H05K 7/14  (2006.01)
  H01R 13/629  (2006.01)
  G06F 1/18  (2006.01)

(52) U.S. Cl.
  CPC ............. *H05K 7/1411* (2013.01); *G06F 1/185* (2013.01); *H01R 13/62955* (2013.01); *H05K 7/1409* (2013.01)

(58) Field of Classification Search
  CPC ..... H05K 7/1409; H05K 7/1411; G06F 1/185; H01R 13/62933; H01R 13/62994; H01R 13/62955
  USPC ................. 361/679.43, 679.57, 679.58, 726, 727,361/740, 747, 754, 755, 759, 798, 801; 439/157, 160, 327, 328, 372
  See application file for complete search history.

(56) References Cited

U.S. PATENT DOCUMENTS

| 5,373,419 A * | 12/1994 | Wright ................. H05K 7/1409 361/754 |
| 2004/0001304 A1* | 1/2004 | Katagiri ............... H05K 7/1409 361/727 |
| 2004/0192095 A1 | 9/2004 | Joist |
| 2006/0134953 A1* | 6/2006 | Williams ............. H05K 7/1411 439/157 |

(Continued)

FOREIGN PATENT DOCUMENTS

| JP | 6-244568 | 9/1995 |
| JP | 2004-343061 | 12/2004 |
| JP | 2008-53749 | 3/2008 |

OTHER PUBLICATIONS

Japanese Office Action dated Apr. 26, 2016 in corresponding Japanese Patent Application No. 2012-240260.

*Primary Examiner* — James Wu
(74) *Attorney, Agent, or Firm* — Staas & Halsey LLP

(57) ABSTRACT

An electronic circuit unit includes an electronic circuit unit main body that is housed in a shelf, a first rotating shaft that is provided on a front side of the electronic circuit unit main body, a lever member rotatably provided about the first rotating shaft for urging the electronic-circuit-unit-main-body toward a depth side of the shelf, a second rotating shaft that is provided in the lever member and extends parallel to the first rotating shaft, a locking member rotatably provided about the second rotating shaft. When the lever member is rotated in a first direction about the first rotating shaft, the electronic circuit unit main body is moved toward a depth side of the shelf. When the lever member is rotated in a second direction, opposite to the first direction, the electronic circuit unit main body is moved toward a front side of the shelf.

8 Claims, 17 Drawing Sheets

(56) References Cited

U.S. PATENT DOCUMENTS

2008/0045051 A1* 2/2008 Sato .................... H05K 7/1409
439/78
2009/0086456 A1 4/2009 Milo et al.
2013/0130528 A1* 5/2013 Jun ..................... H05K 7/1409
439/160

* cited by examiner

ELECTRONIC CIRCUIT UNIT AND COMMUNICATION DEVICE

CROSS-REFERENCE TO RELATED APPLICATION

This application is based upon and claims the benefit of priority of the prior Japanese Patent Application No. 2012-240260, filed on Oct. 31, 2012, the entire contents of which are incorporated herein by reference.

FIELD

The embodiment discussed herein is related to electronic circuit units and communication devices.

BACKGROUND

In the past, an electronic circuit unit insertion and removal mechanism for inserting and removing an electronic circuit unit into and from a shelf has been known (see, for example, Japanese Laid-open Patent Publication No. 2008-53749). According to this insertion and removal mechanism, the shelf includes a groove section, the electronic circuit unit includes a rotatable lever provided with an engaging section at the tip thereof, a rotatable stopper that is connected to the lever and is provided with an engaging section at the tip thereof, and a housing section that houses the lever and the stopper and is provided internally with an engaging surface that may engage the engaging section of the stopper, the shelf is locked to the electronic circuit unit as a result of the lever being rotated and the engaging section of the lever engaging the groove section of the shelf, and, even when an unlocking force acts on the electronic circuit unit, the engagement between the engaging surface of the housing section and the engaging section of the stopper is not released.

SUMMARY

According to an aspect of the invention, an electronic circuit unit includes an electronic circuit unit main body that is housed in a shelf, the electronic circuit unit main body being inserted in the shelf; a first rotating shaft that is provided on a front side of the electronic circuit unit main body in a viewpoint of a direction in which the electronic circuit unit main body is inserted; a lever member that is rotatably provided about the first rotating shaft, the lever member urging the electronic circuit unit main body toward a depth side of the shelf by a principle of leverage by making contact with part of the shelf when the lever member is rotated in a first direction about the first rotating shaft and urging the electronic circuit unit main body toward a front side of the shelf by the principle of leverage by making contact with another part of the shelf when the lever member is rotated in a second direction about the first rotating shaft, the second direction being opposite to the first direction; a second rotating shaft that is provided in the lever member and extends parallel to the first rotating shaft; and a locking member that is rotatably provided about the second rotating shaft, the locking member locking the lever member in such a way that rotation of the lever member in the second direction about the first rotating shaft is disabled in a state in which insertion of the electronic circuit unit main body into the shelf is completed, the locking member applying, to the lever member, a force that rotates the lever member in the second direction about the first rotating shaft while lifting a locked state of the lever member when the locking member is rotated in a second direction about the second rotating shaft in the locked state of the lever member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preliminary Consideration

The above structure described in Japanese Laid-open Patent Publication No. 2008-53749 does not provide a high degree of ease of use in initial operation which is performed when the electronic circuit unit is detached from a state in which insertion of the electronic circuit unit into the shelf is completed. Specifically, in the operation of the above structure, it is desired that the engagement be released by rotating the stopper in a counterclockwise direction and then the lever be rotated in a clockwise direction while holding the stopper in the rotational position (because, if a hand is released from the stopper, the stopper rotates in a clockwise direction and returns to an original position by the urging force of a spring), which results in a low degree of ease of use.

Therefore, it is desired to enhance ease of use at the time of detachment of the electronic circuit unit from the shelf.

Hereinafter, an embodiment will be described in detail with reference to the attached drawings.

Figure 1:
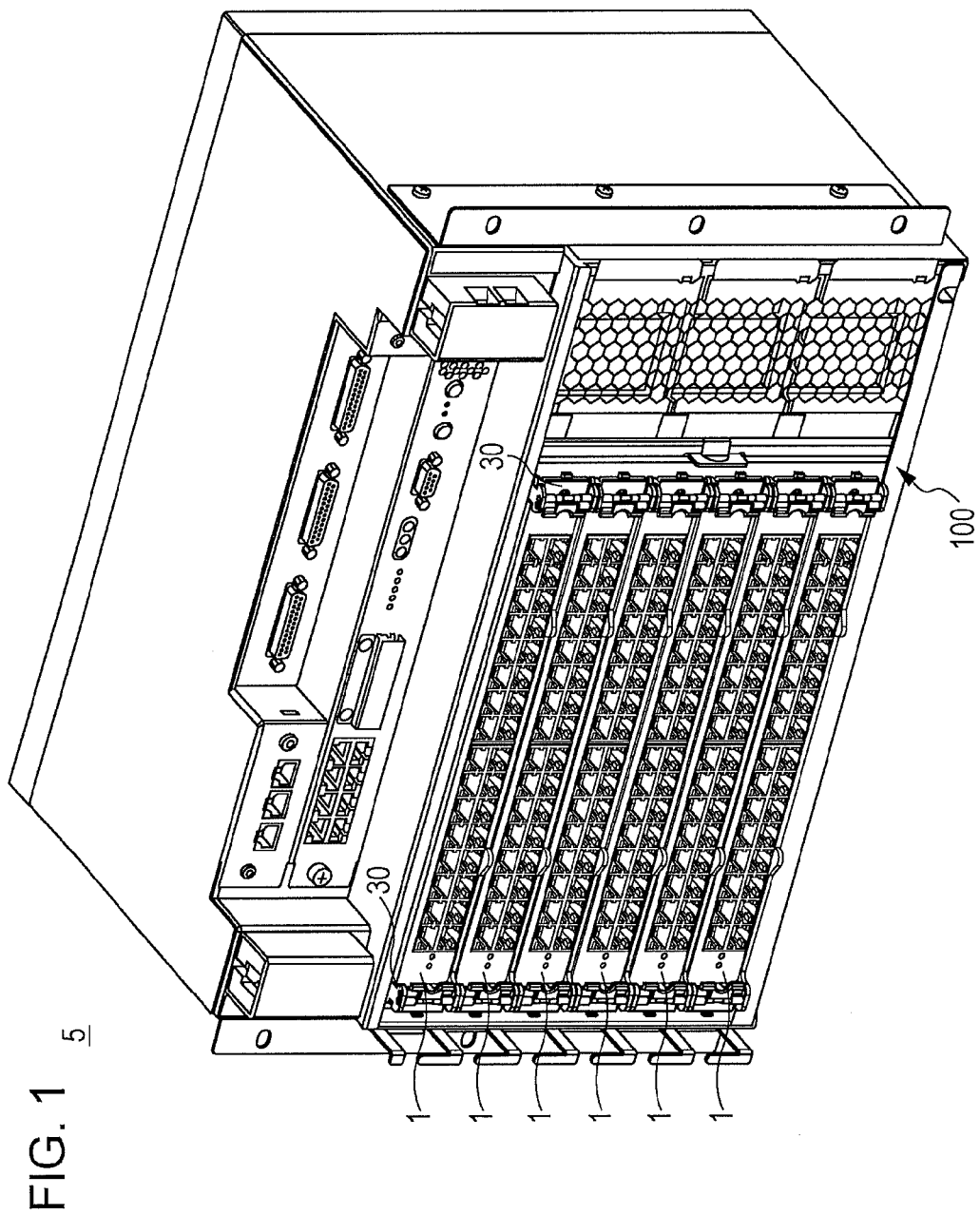
FIG. 1 is a diagram of the appearance of an example of a communication device incorporating an electronic circuit unit.

FIG. 1 is a diagram of the appearance of an example of a communication device 5 incorporating an electronic circuit unit 1. The communication device 5 may include a plurality of electronic circuit units 1. The communication device 5 is provided with a shelf 100. In an example depicted in FIG. 1, a plurality of electronic circuit units 1 are housed in the shelf 100 by being inserted thereinto. The communication device 5 is, for example, an optical transmission device, but may be other communication devices.

Figure 2:
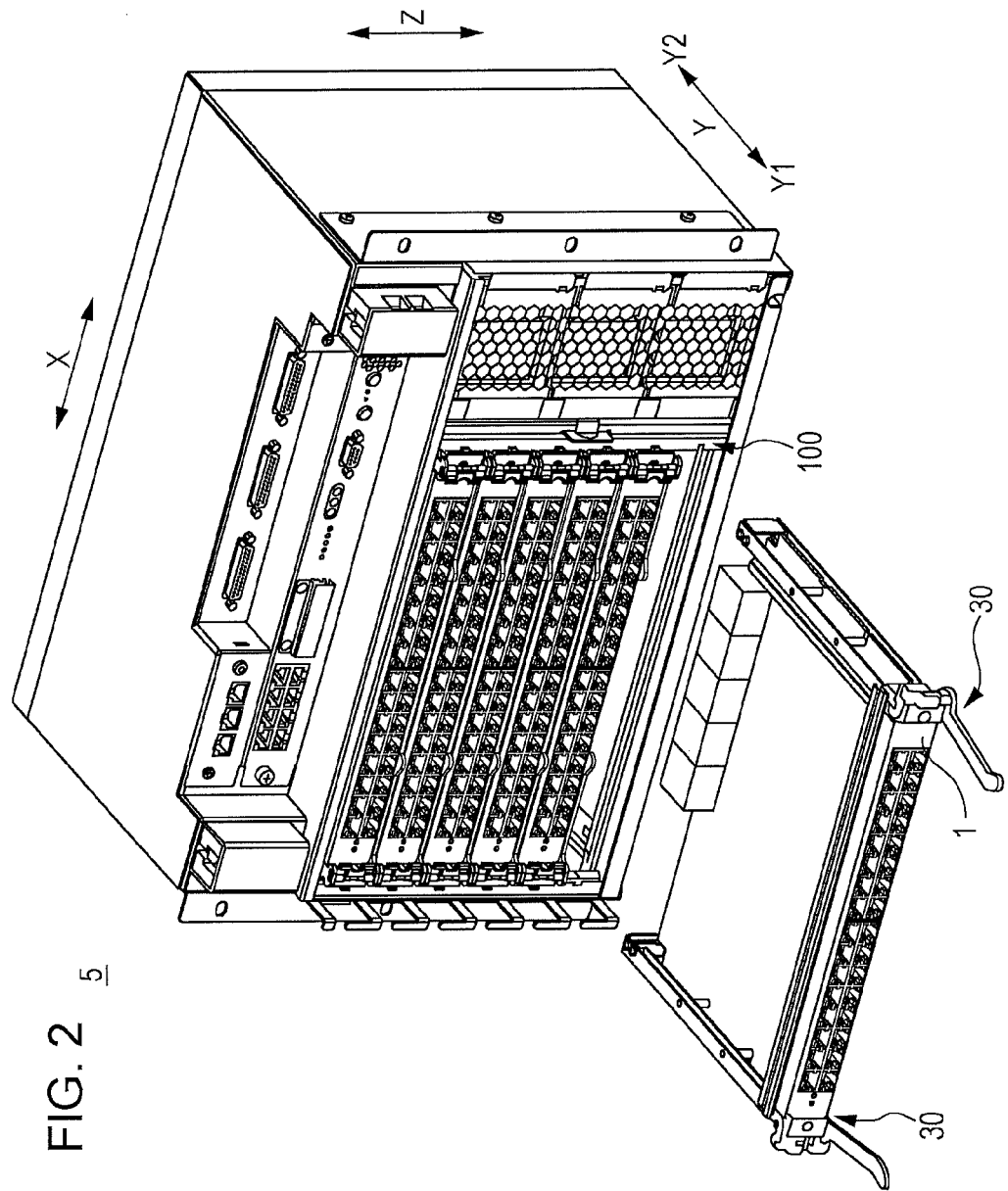
FIG. 2 is a diagram of a state in which one electronic circuit unit is detached from the communication device depicted in FIG. 1.

FIG. 2 is a diagram of a state in which one electronic circuit unit 1 is detached from the communication device 5 depicted in FIG. 1. Each electronic circuit unit 1 may be inserted into and removed from the shelf 100 by operation of an insertion and removal lever 30 which will be described later.

Hereinafter, for convenience of explanation, a Z direction of FIG. 2 is referred to as a vertical direction (a direction toward an upper side in FIG. 2 is referred to as an upper direction), a Y direction is referred to as a depth direction, and an X direction is referred to as a width direction. The Y direction corresponds to a direction into and from which the electronic circuit unit 1 is inserted and removed. The Y1 side in the Y direction is assumed to be a front side (front direction), and the Y2 side in the Y direction is assumed to be a depth side.

Figure 3:
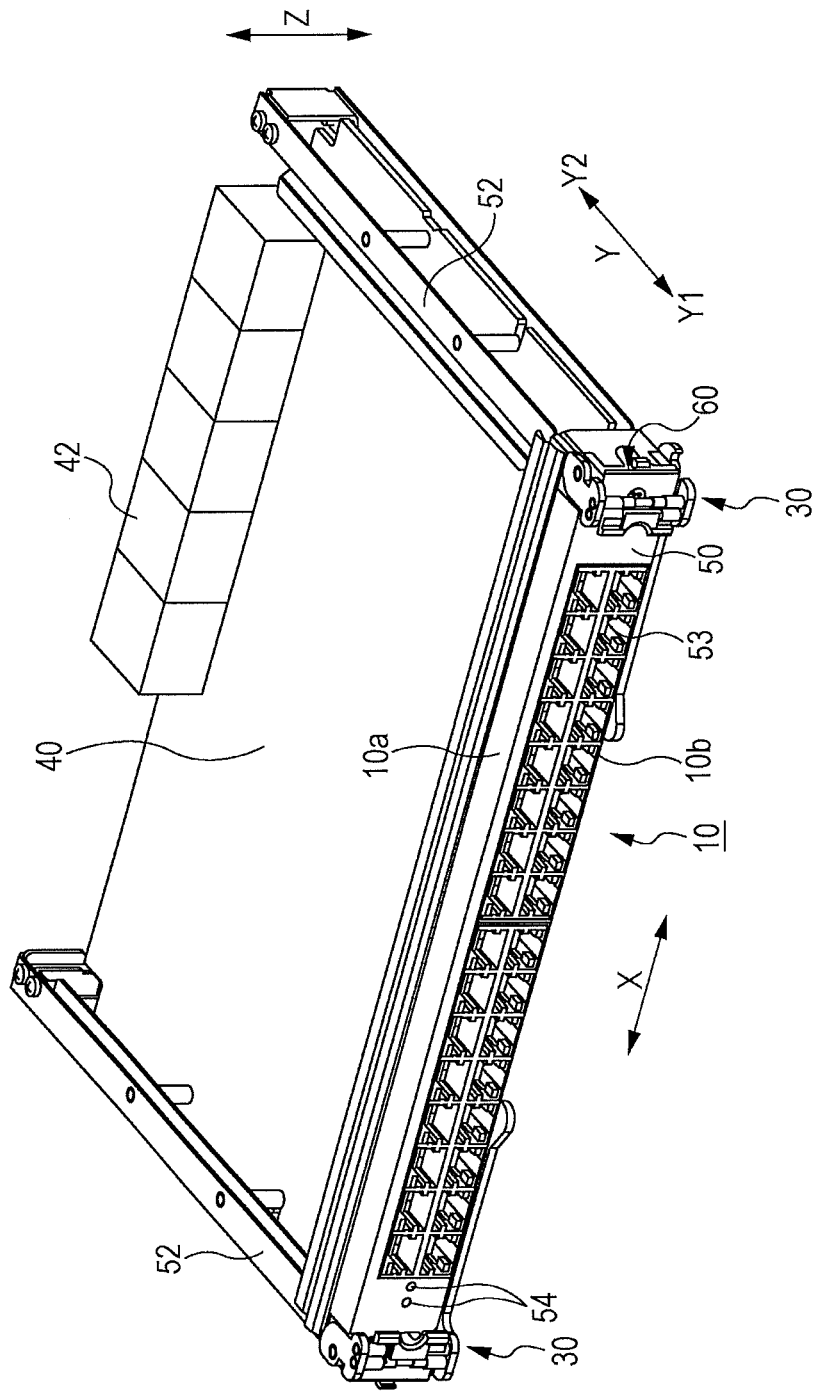
FIG. 3 is a diagram of the appearance of an example of the electronic circuit unit provided with an insertion and removal lever.

FIG. 3 is a diagram of the appearance of an example of the electronic circuit unit 1 provided with the insertion and removal lever 30. Here, one electronic circuit unit 1 will be described, but the same may go for the other electronic circuit units 1.

The electronic circuit unit 1 includes an electronic circuit unit main body 10 and the insertion and removal lever 30.

The electronic circuit unit main body 10 includes a base plate 40, a connector 42, a front section (a front panel) 50, and a locked member 60.

The base plate 40 is provided with an electronic circuit. For example, the base plate 40 may be an electronic circuit board itself or may be a plate material, for example, a sheet metal member, that holds an electronic circuit board.

The connector 42 may be attached to an edge of the base plate 40 on the depth side of the electronic circuit unit main body 10. The connector 42 is fitted into a connector (which is not depicted) on a backboard of the shelf 100, for example. The connector 42 is able to connect the electronic circuit in the base plate 40 to an electronic circuit on the backboard.

The front section 50 forms the front side of the electronic circuit unit main body 10. The front section 50 may be attached to an edge of the base plate 40 on the side thereof opposite to the connector 42. In the front section 50, as depicted in FIG. 3, a plurality of ports 53, alarm lamps 54, and so forth may be set. In an example depicted in FIG. 3, the front section 50 forms a multiport connection part (a front access section) provided with a plurality of ports 53. Incidentally, in the example depicted in FIG. 3, in addition to a vertical surface (an X-Z plane), that is, a surface on the front side (a surface in which the ports 53 and so forth are provided), the front section 50 has a top surface (an X-Y plane).

The locked member 60 forms a locked state of a lever member 320, which is described later, of the insertion and removal lever 30 in cooperation with a locking member 340 of the insertion and removal lever 30. The details of the locked member 60 will be described with reference to FIG. 5.

Incidentally, in the example depicted in FIG. 3, the electronic circuit unit main body 10 is provided with side sections 52 at both ends in a width direction where the side sections 52 extend in a depth direction. The front side of each side section 52 is connected to the front section 50.

The insertion and removal lever 30 is provided on the front side of the electronic circuit unit main body 10, that is, on the side where the front section 50 is located. The insertion and removal lever 30 is provided at both ends of the electronic circuit unit main body 10 in a width direction. That is, the right and left insertion and removal levers 30 are provided in a pair in the electronic circuit unit main body 10 in a width direction. The pair of right and left insertion and removal levers 30 may have a symmetrical configuration.

Figure 4:
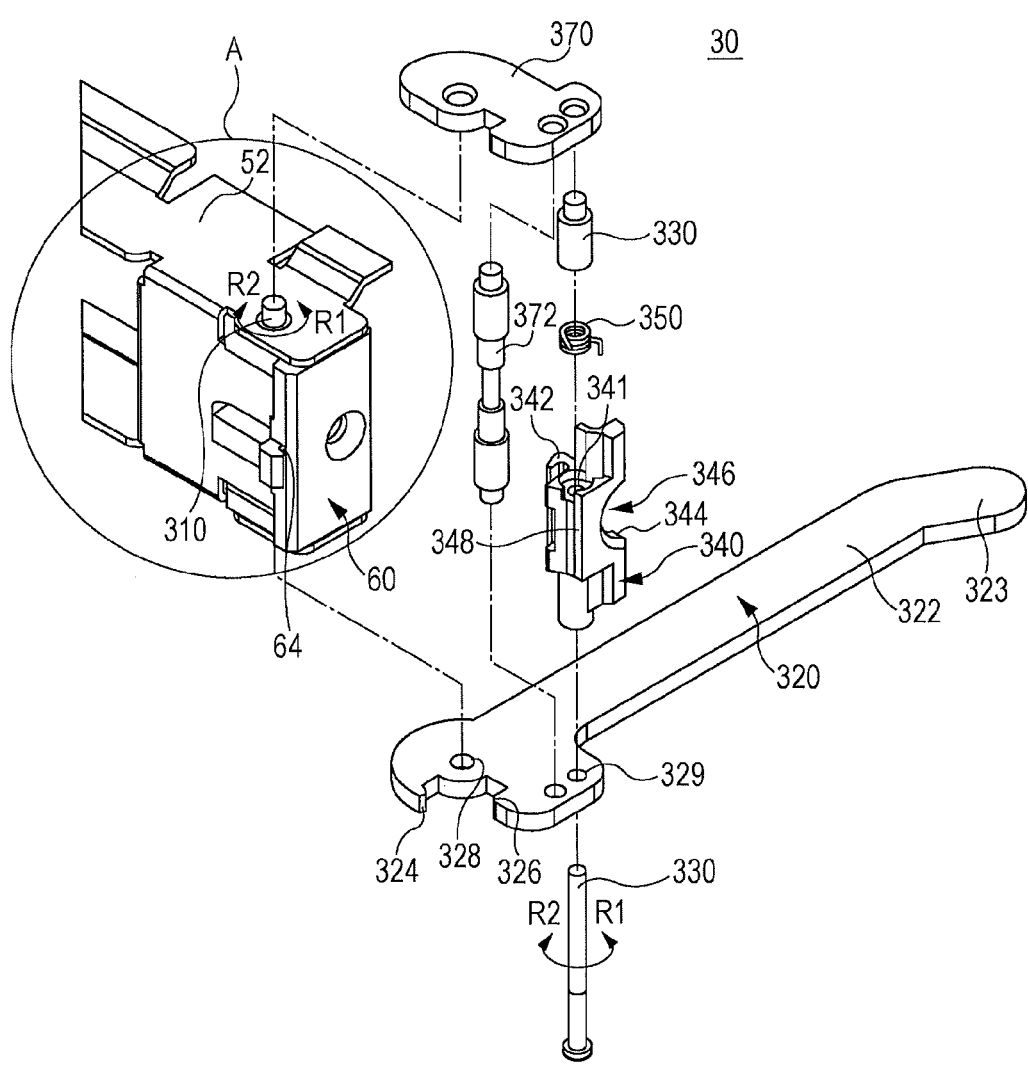
FIG. 4 is an exploded perspective view of an example of the insertion and removal lever.

FIG. 4 is an exploded perspective view of an example of the insertion and removal lever 30. In an example depicted in FIG. 4, the left-hand insertion and removal lever 30 in FIG. 3 is depicted. In the example depicted in FIG. 4, the insertion and removal lever 30 is provided on the front side of the side section 52 of the electronic circuit unit main body 10. However, the insertion and removal lever 30 may be provided at each end of the front section 50 in a width direction by extending the front section 50 in the width direction.

The insertion and removal lever 30 includes a lever shaft 310, the lever member 320, a locking rotating shaft 330, and the locking member 340.

The lever shaft 310 forms a rotating shaft (a first rotating shaft) of the lever member 320. As depicted in FIG. 4, the lever shaft 310 is provided at a front-side end of the electronic circuit unit main body 10 (in the example depicted in FIG. 4, on the front side of the side section 52). The lever shaft 310 extends in a vertical direction. As depicted in FIG. 4, the lever shaft 310 may be provided in such a way as to penetrate the front-side end of the electronic circuit unit main body 10 in a vertical direction, and, at the ends in a vertical direction, an upper plate 370 and the lever member 320 are attached. Incidentally, the lever shaft 310 may be held in such a way as to be rotatable with respect to the electronic circuit unit main body 10 (that is, the lever shaft 310 itself may rotate) or may be fixed to the electronic circuit unit main body 10. When the lever shaft 310 is held in such a way as to be rotatable with respect to the electronic circuit unit main body 10, the upper plate 370 and the lever member 320 may be fixed to the lever shaft 310; when the lever shaft 310 is fixed to the electronic circuit unit main body 10, the upper plate 370 and the lever member 320 may be rotatably attached to the lever shaft 310.

The lever member 320 is provided in such a way as to be rotatable about the first rotating shaft formed as the lever shaft 310. The lever member 320 is rotatable in both a first direction R1 and a second direction R2. Here, it is assumed that the first direction R1 corresponds to a direction in which the insertion and removal lever 30 is closed and the second direction R2 corresponds to a direction in which the insertion and removal lever 30 is opened. That is, the first direction R1 is a direction in which the lever member 320 is rotated when the electronic circuit unit 1 is inserted and the second direction R2 is a direction in which the lever member 320 is rotated when the electronic circuit unit 1 is detached. Terms "the first direction R1" and "the second direction R2" are used similarly when a direction in which the locking member 340 is rotated is described. Incidentally, assuming that a direction of rotation is a clockwise direction or a counterclockwise direction viewed from above, the first direction R1 and the second direction R2 of the right insertion and removal lever 30 correspond to the second direction R2 and the first direction R1 of the left insertion and removal lever 30.

In the example depicted in FIG. 4, the lever member 320 is disposed in such a way that the lever member 320 rotates in a plane located below a front-side lower surface 10b (see FIG. 3) of the electronic circuit unit main body 10. However, the lever member 320 may be disposed in such a way that the lever member 320 rotates in a plane located above a front-side top surface 10a (see FIG. 3) of the electronic circuit unit main body 10. Incidentally, the front-side top surface 10a of the electronic circuit unit main body 10 may be formed as any one of a top surface of the front section 50 and a front-side top surface of the side section 52 or both. Moreover, the front-side lower surface 10b of the electronic circuit unit main body 10 may be formed as any one of a lower surface of the front section 50 and a front-side lower surface of the side section 52 or a front-side lower surface of the base plate 40 or both.

Preferably, the lever member 320 is formed of a thin plate material from the viewpoint of reducing the thickness of the electronic circuit unit 1 in a vertical direction. The lever member 320 may be made of a metal material or may be made of resin. The lever member 320 is provided with a lever operation section 322 that is operated by the user. The lever operation section 322 may have any shape, but, as depicted in FIG. 4, the lever operation section 322 may have a shape that extends in a given direction and bends, at a tip section 323 (an end distant from the rotation center), toward the front side with consideration given to ease of use. At a rotation center's-side end of the lever member 320, a hole 328 through which the lever shaft 310 is placed is formed. The lever member 320 is provided with first and second contact sections 324 and 326 on the inward side in a radial direction in positions closer to the hole 328 than the lever operation section 322 of the lever member 320. The first and second contact sections 324 and 326 function as fulcrums when leverage, which will be described later, is generated. Incidentally, in the example depicted in FIG. 4, the first and second contact sections 324 and 326 are disposed on the side substantially opposite to the lever operation section 322 with respect to the hole 328. The lever member 320 is also provided with a hole 329 through which the locking rotating shaft 330 is placed.

Incidentally, in the example depicted in FIG. 4, the upper plate 370 is provided in such a way as to face the rotation center's-side end of the lever member 320. The upper plate 370 is disposed at a level substantially corresponding to the front-side top surface 10a of the electronic circuit unit main body 10. The upper plate 370 vertically holds the locking rotating shaft 330 (the same goes for a force transmission member 372 which will be described later) in cooperation with the rotation center's-side end of the lever member 320. However, the upper plate 370 may be omitted. In this case, the locking rotating shaft 330 (the same goes for the force transmission member 372 which will be described later) may have a cantilever structure.

The locking rotating shaft 330 forms a rotating shaft (a second rotating shaft) of the locking member 340. The locking rotating shaft 330 is provided in the lever member 320. The locking rotating shaft 330 is provided parallel to the lever shaft 310. That is, as is the case with the lever shaft 310, the locking rotating shaft 330 extends in a vertical direction. The locking rotating shaft 330 may be attached to the upper plate 370 and the lever member 320 and extends between the upper plate 370 and the lever member 320. The locking member 340 is rotatably provided about the locking rotating shaft 330. Incidentally, in the example depicted in FIG. 4, the locking rotating shaft 330 is fixed to the upper plate 370 and the lever member 320. For example, the locking rotating shaft 330 may be fixed to the upper plate 370 and the lever member 320 by caulking or the like. However, the locking rotating shaft 330 may be supported in such a way as to be rotatable with respect to the upper plate 370 and the lever member 320 (that is, the locking rotating shaft 330 itself may rotate). When the locking rotating shaft 330 is rotatable with respect to the upper plate 370 and the lever member 320, the locking member 340 may be fixed to the locking rotating shaft 330. Incidentally, as depicted in FIG. 4, the locking rotating shaft 330 may be formed of two members.

The locking member 340 is rotatably provided about the second rotating shaft formed as the locking rotating shaft 330. The locking member 340 is rotatable in both the first direction R1 and the second direction R2. Incidentally, as described above, the locking rotating shaft 330 is provided in the lever member 320. Therefore, the locking member 340 is configured to be rotatable with respect to the lever member 320. Incidentally, in terms of a clockwise direction and a counterclockwise direction, the first direction R1 and the second direction R2 related to the direction of rotation of the locking member 340 are the same as the above-described first direction R1 and second direction R2 related to the direction of rotation of the lever member 320. For example, as for the left-hand insertion and removal lever 30 depicted in FIG. 4, the first direction R1 is a counterclockwise direction viewed from above and the second direction R2 is a clockwise direction viewed from above.

Preferably, as depicted in FIG. 4, the locking member 340 is provided in a height range between the top surface 10a and the lower surface 10b (see FIG. 3) of the electronic circuit unit main body 10 such that the locking member 340 does not become a factor in the increase of the thickness of the electronic circuit unit 1 in a vertical direction. That is, the locking member 340 is provided below the top surface 10a of the electronic circuit unit main body 10 and above the lower surface 10b of the electronic circuit unit main body 10. In the example depicted in FIG. 4, the locking member 340 is provided in such a way as to occupy a middle position of the electronic circuit unit main body 10 in a vertical direction.

The locking member 340 is provided with a hook section 342 for locking. The hook section 342 has a shape that may generate a locking force in the direction of rotation about the locking rotating shaft 330. The locking function of the hook section 342 will be described later. Incidentally, in the example depicted in FIG. 4, the locking member 340 is provided with a hole 341 through which the locking rotating shaft 330 is placed.

The locking member 340 is provided with an operation section 344 that is operated by the user. The operation section 344 may have any shape, but, from the viewpoint of enhancing ease of use by a single finger of the user (from an ergonomic standpoint), the operation section 344 may have a notch 346. As will be described later, the notch 346 also serves the function of increasing the visibility of the alarm lamps 54 (see FIGS. 3 and 7).

Preferably, the insertion and removal lever 30 is provided with the force transmission member 372. The force transmission member 372 is provided in the lever member 320. The force transmission member 372 has the function of transmitting a force to the lever member 320, the force applied to the locking member 340 to rotate the locking member 340 about the locking rotating shaft 330 in the second direction R2. In the example depicted in FIG. 4, the force transmission member 372 extends in a vertical direction parallel to the locking rotating shaft 330 and is fixed to the upper plate 370 and the lever member 320. The locking member 340 is provided with a contact section 348 that makes contact with the force transmission member 372 when the locking member 340 is rotated about the locking rotating shaft 330 in the second direction R2. Incidentally, as will be described later, the force transmission member 372 may have the function of locking the rotation of the locking member 340 in the first direction R1.

Preferably, the insertion and removal lever 30 is provided with an elastic member 350. The elastic member 350 urges the locking member 340 in such a way that the locking member 340 rotates in the first direction R1 about the locking rotating shaft 330. The elastic member 350 is provided in such a way that an elastic force is transmitted between the lever member 320 and the locking member 340. In the example depicted in FIG. 4, the elastic member 350 is a small wire spring, and, for example, one end thereof is held by the force transmission member 372 (see FIG. 8) and the other end thereof is held by the locking member 340. In this case, when, for example, the locking member 340 is rotated in the second direction R2 with respect to the lever member 320 by user operation, the elastic member 350 is elastically deformed, and the lever member 320 experiences the elastic force (the reaction force of the force that rotates the locking member 340 in the first direction R1) at that time via the locking rotating shaft 330. When such an elastic force is transmitted, the lever member 320 is urged in such a way as to rotate about the lever shaft 310 in the second direction R2. Incidentally, when the urging force generated by the transmission of the elastic force may produce first motion of the lever member 320 that rotates about the lever shaft 310 in the second direction R2, the above-described force transmission member 372 (and the contact section 348) may be omitted. Furthermore, it is preferable to integrate several members such as the rocking rotating shaft 330, the upper plate 370, and the force transmission member 372 to decrease a cost for parts or for improvement of assembling. The lever member 320, a part of the locking member 340, and a part of the force transmission member 372 are preferably integrated as well. For ease in assembling, it is preferable to use a screw for clamping the locking rotating shaft 330 and the upper plate 370 instead of swaging them.

Figure 5:
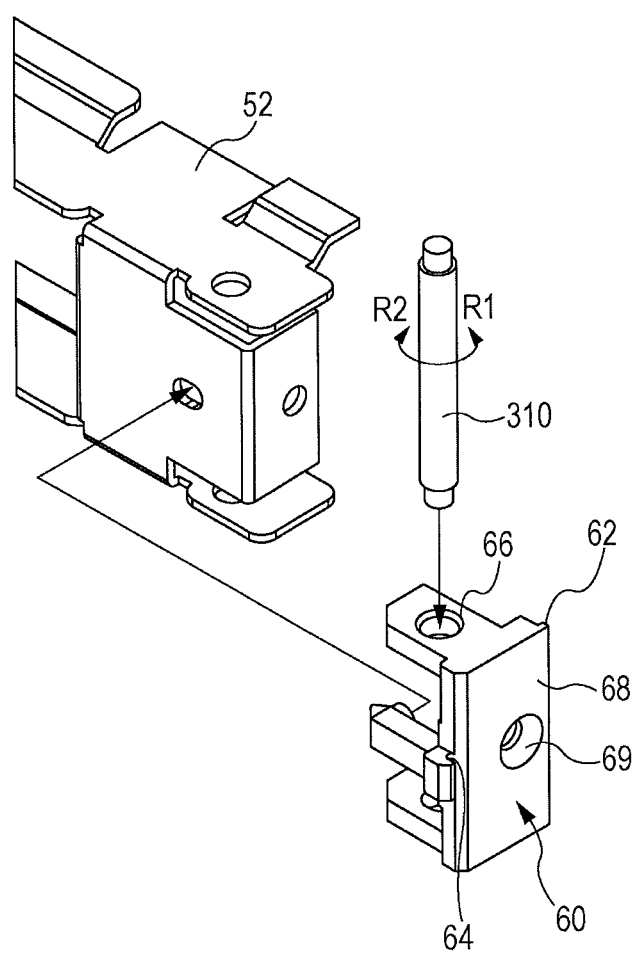
FIG. 5 is an exploded perspective view of an A portion of FIG. 4.

FIG. 5 is an exploded perspective view of an A portion of FIG. 4. The locked member 60 is provided in the electronic circuit unit main body 10. The locked member 60 is provided in such a way as to fulfill a locking function in cooperation with the locking member 340. In an example depicted in FIG. 5, the locked member 60 is provided in such a way as to cover a front-side surface of the side section 52 of the electronic circuit unit main body 10. The locked member 60 may be fixed to the side section 52 by being fitted thereonto or may be fixed thereto by other connection methods. Moreover, the locked member 60 may be fastened to the side section 52 with a screw 800 (see FIG. 12). Incidentally, as depicted in FIG. 5, a front face 68 of the locked member 60 may have a hole 69 through which the screw 800 is placed. Moreover, as depicted in FIG. 5, the locked member 60 may have a hole 66 through which the lever shaft 310 is placed.

The locked member 60 is provided with a first locking member receiving section 62 and a second locking member receiving section 64. Incidentally, the locked member 60 may be formed of two members, and each member may be provided with the first locking member receiving section 62 and the second locking member receiving section 64.

The first locking member receiving section 62 includes a shape that allows the hook section 342 of the locking member 340 to engage the first locking member receiving section 62. In a state in which the hook section 342 engages the first locking member receiving section 62 (hereinafter referred to as a "first locked state"), the rotation of the lever member 320 in the second direction R2 is restricted. The first locked state is brought about when the lever member 320 is rotated to a closed position (the position of the lever member 320 at the completion of the insertion of the electronic circuit unit 1) in the first direction R1. By rotating the locking member 340 in the second direction R2 by user operation, the first locked state is released. That is, when the locking member 340 is rotated in the second direction R2 by user operation, the hook section 342 of the locking member 340 is disengaged from the first locking member receiving section 62 and the first locked state is released.

The second locking member receiving section 64 includes a shape that allows the hook section 342 of the locking member 340 to engage the second locking member receiving section 64. In a state in which the hook section 342 engages the second locking member receiving section 64 (hereinafter referred to as a "second locked state"), the rotation of the lever member 320 in the second direction R2 is restricted. The second locked state is brought about when the lever member 320 is rotated to an open position in the second direction R2. In other words, the second locking member receiving section 64 defines the maximum degree of opening (open position) of the lever member 320. Incidentally, in the second locked state, the lever member 320 is allowed to rotate in the first direction R1.

Figure 6:
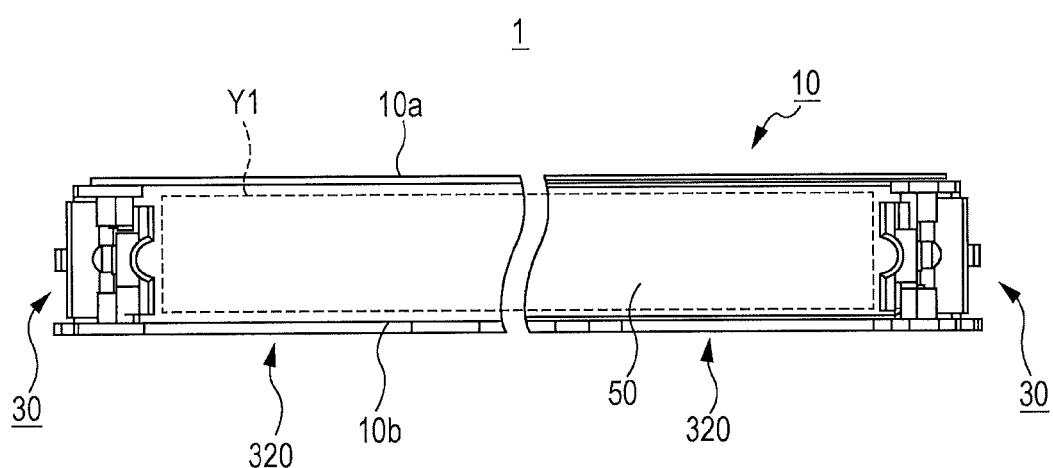
FIG. 6 is a front view of one electronic circuit unit viewed from the front side.

FIG. 6 is a front view of one electronic circuit unit 1 viewed from the front side. In FIG. 6, an area in the front section 50, the area in which the ports 53 and so forth may be provided, is indicated as a dotted area Y1.

As depicted in FIG. 6, practically only the thickness of the lever member 320 of the insertion and removal lever 30 affects the entire thickness of the electronic circuit unit 1, which makes it possible to implement the insertion and removal lever 30 without interfering with the achievement of a thinner electronic circuit unit 1. Incidentally, in an example depicted in FIG. 6, the base plate 40 is offset downward by a height corresponding to the thickness of the lever member 320 more on the depth side than the rotating range of the lever member 320. Therefore, in the example depicted in FIG. 6, the lower surface defining the thickness of the electronic circuit unit 1 is formed by the lever member 320 and the base plate 40.

Moreover, the insertion and removal lever 30 is provided at right and left ends of the electronic circuit unit main body 10 in a width direction, which makes it possible to implement the insertion and removal lever 30 without imposing much restriction on the area in the front section 50 in which the ports 53 and so forth are provided as indicated with the dotted area Y1. In particular, as described earlier, since the locking member 340 is disposed at the ends of the electronic circuit unit main body 10 in a width direction in a space below the top surface 10a of the electronic circuit unit main body 10 and above the lower surface 10b of the electronic circuit unit main body 10, the locking member 340 does not interfere with the achievement of a thinner electronic circuit unit 1 and does not interfere with the area in the front section 50 in which the ports 53 and so forth are provided.

Figure 7:
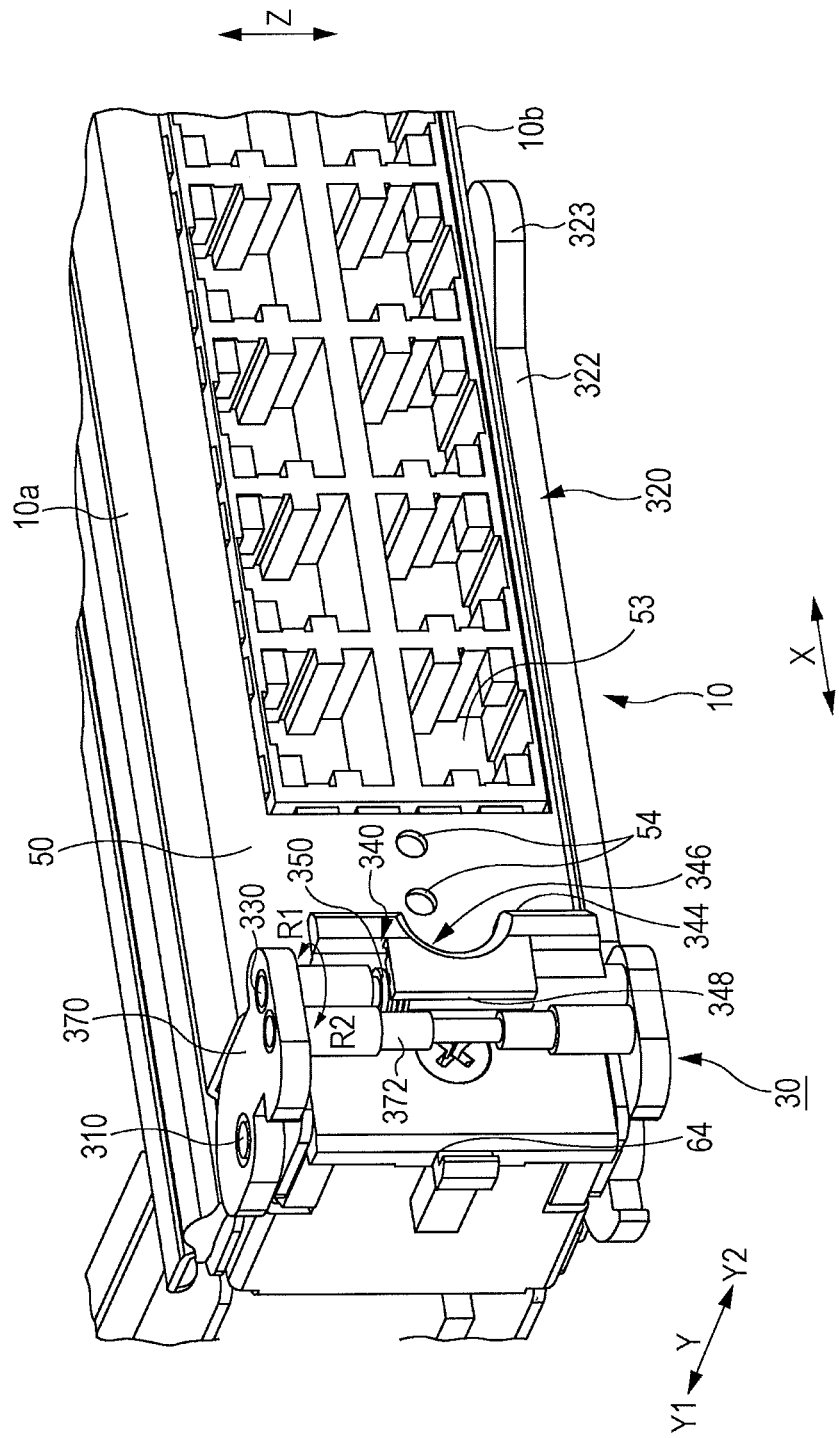
FIG. 7 is a perspective view of part of the electronic circuit unit in a state in which a lever member is in a closed position.

FIG. 7 is a perspective view of part (a left-hand front end) of the electronic circuit unit 1 in a state in which the lever member 320 is in the closed position. The state in which the lever member 320 is in the closed position corresponds to a state in which the insertion of the electronic circuit unit 1 into the shelf 100 is completed. Incidentally, in FIG. 7, the shelf 100 is not depicted.

As depicted in FIG. 7, in a state in which the lever member 320 is in the closed position, the lever operation section 322 of the lever member 320 is located more on the depth side than the front section 50 of the electronic circuit unit main body 10 except for the tip section 323. That is, expect for the tip section 323, the lever operation section 322 does not jut out from the front section 50 of the electronic circuit unit main body 10 toward the front side. Incidentally, in an example depicted in FIG. 7, since the tip section 323 of the lever operation section 322 bends toward the front side, the tip section 323 slightly juts out from the front section 50 of the electronic circuit unit main body 10 toward the front side. However, the tip section 323 of the lever operation section 322 may also be configured to be located more on the depth side than the front section 50. As described above, since almost the whole of the lever operation section 322 of the lever member 320 does not jut out from the front section 50 of the electronic circuit unit main body 10 toward the front side in a state in which the lever member 320 is in the closed position, it is possible to maintain easy accessibility of the ports 53 (the front access section) in the front section 50. That is, when the lever operation section 322 of the lever member 320 juts out from the front section 50 of the electronic circuit unit main body 10 toward the front side in a state in which the lever member 320 is in the closed position, the lever operation section 322 becomes a hindrance and reduces the accessibility of the ports 53 in the front section 50. On the other hand, according to the example depicted in FIG. 7, since almost the whole of the lever operation section 322 of the lever member 320 is housed more on the depth side than the front section 50 of the electronic circuit unit main body 10 in a state in which the lever member 320 is in the closed position, the accessibility of the ports 53 in the front section 50 is increased.

Figure 9:
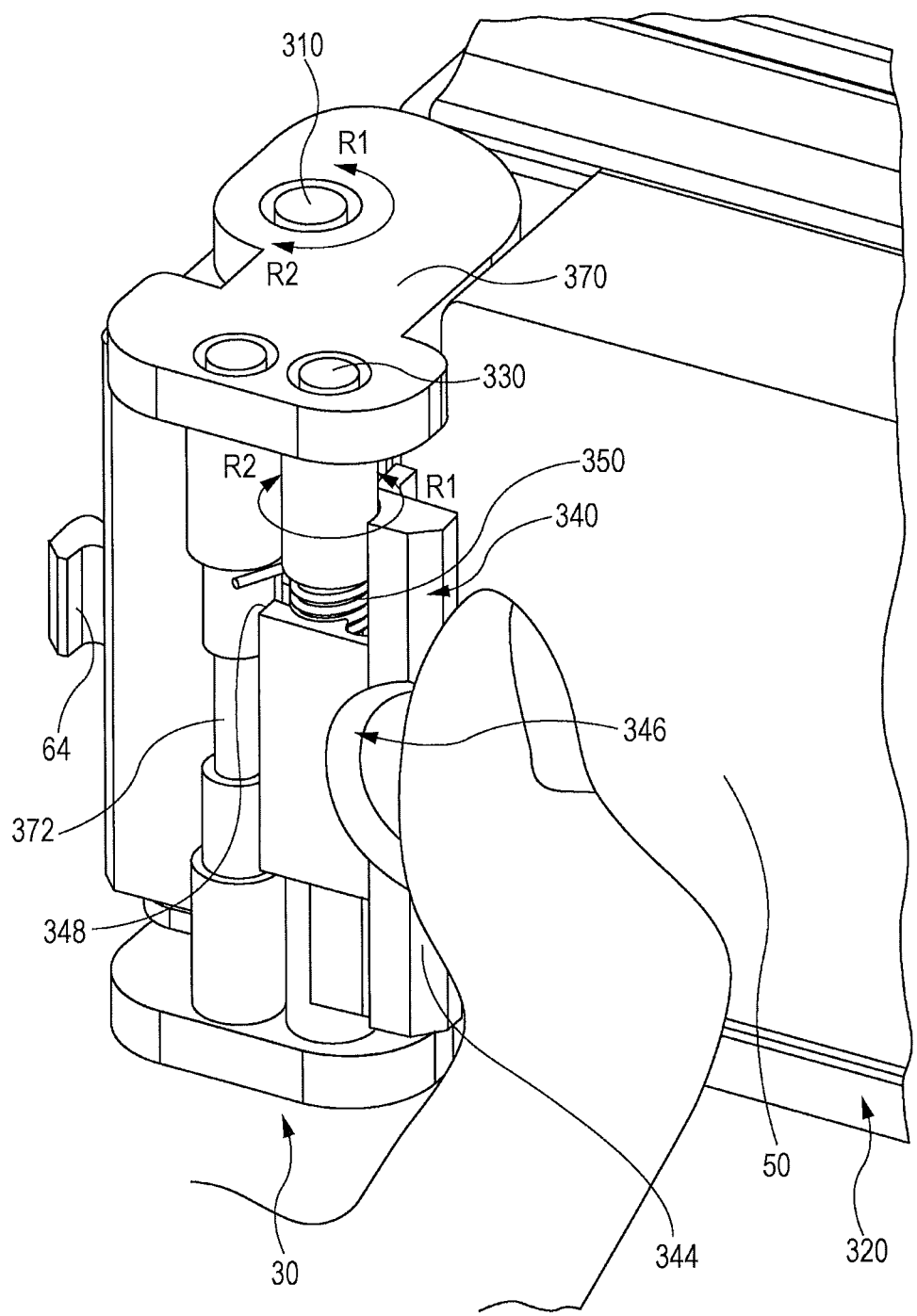
FIG. 9 is a perspective view of an example of an operating state when a first locked state of a locking member is lifted.

Moreover, as depicted in FIG. 7, even when the front section 50 is viewed obliquely from the left-hand front in a width direction, it is possible to check the alarm lamps 54 visually through the notch 346 of the locking member 340. That is, when such a notch 346 is not present in the locking member 340, it becomes difficult to see the alarm lamps 54 (in particular, the leftmost alarm lamp 54) when the front section 50 is viewed obliquely from the left-hand front in a width direction. On the other hand, by providing the notch 346 in the locking member 340, it is possible to increase visibility and see the alarm lamps 54 clearly in a state in which the lever member 320 is in the closed position. Furthermore, the notch 346 of the locking member 340 has also an advantage in enhanced ease of use when the first locked state is lifted. That is, the presence of the notch 346 in the locking member 340 allows the user to understand intuitively that the user simply puts a finger in the notch 346 to perform operation (or simply places a finger on the corner of the notch 346 to perform operation as depicted in FIG. 9). Moreover, since the notch 346 provides proper engagement with a finger, it is possible to enhance ease of use at the time of rotational operation of the locking member 340 in the second direction R2. However, the locking member 340 may include a configuration in which such a notch 346 is not provided.

Next, with reference to FIGS. 8 to 13, operation of the insertion and removal lever 30 at the time of detachment of the electronic circuit unit 1 and the state of the insertion and removal lever 30 in each operational stage and so forth will be described.

Figure 8:
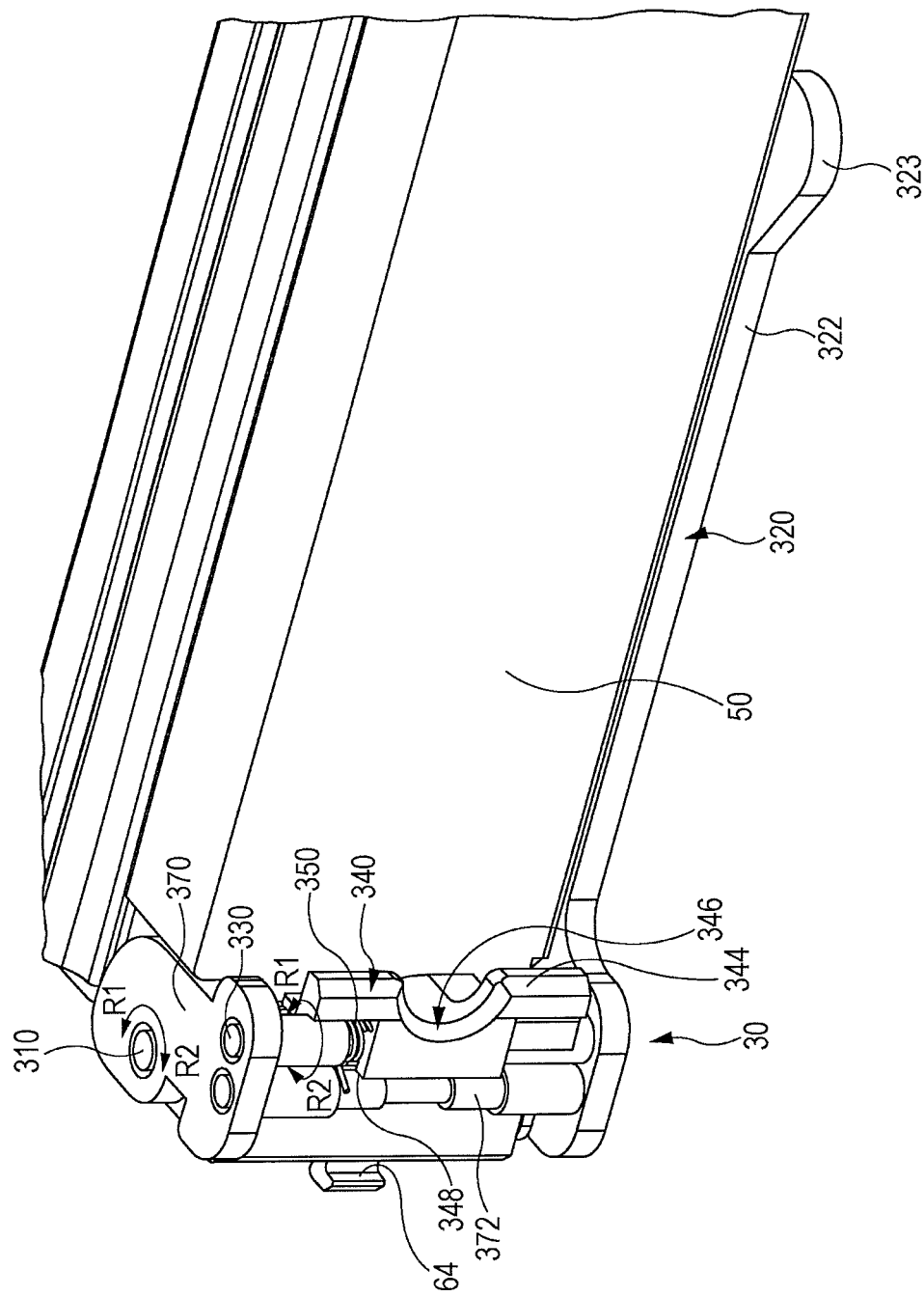
FIG. 8 is a perspective view of the state of the insertion and removal lever when the lever member is in the closed position.
Figure 10:
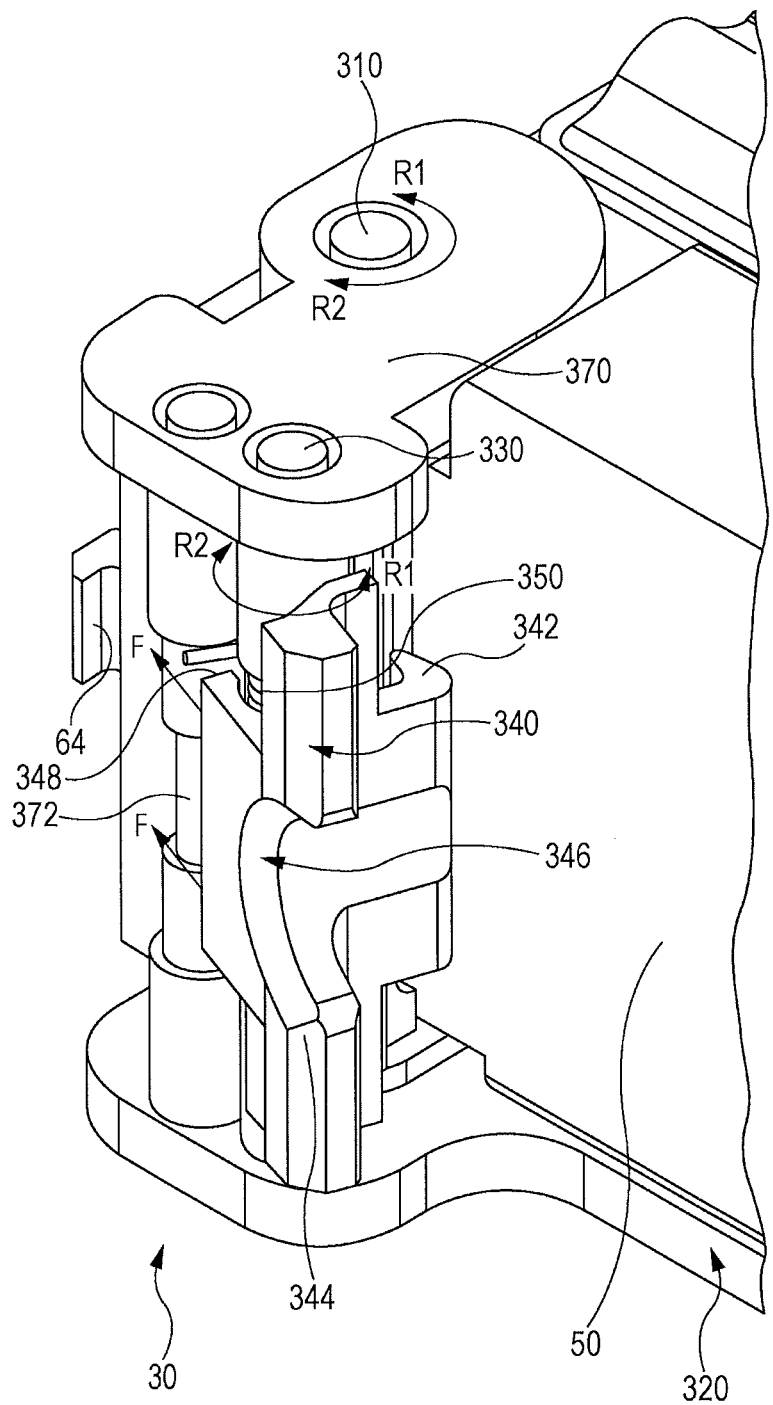
FIG. 10 is a perspective view of an example of an operating state when the first locked state is lifted (or immediately after the first locked state is lifted)
Figure 11:
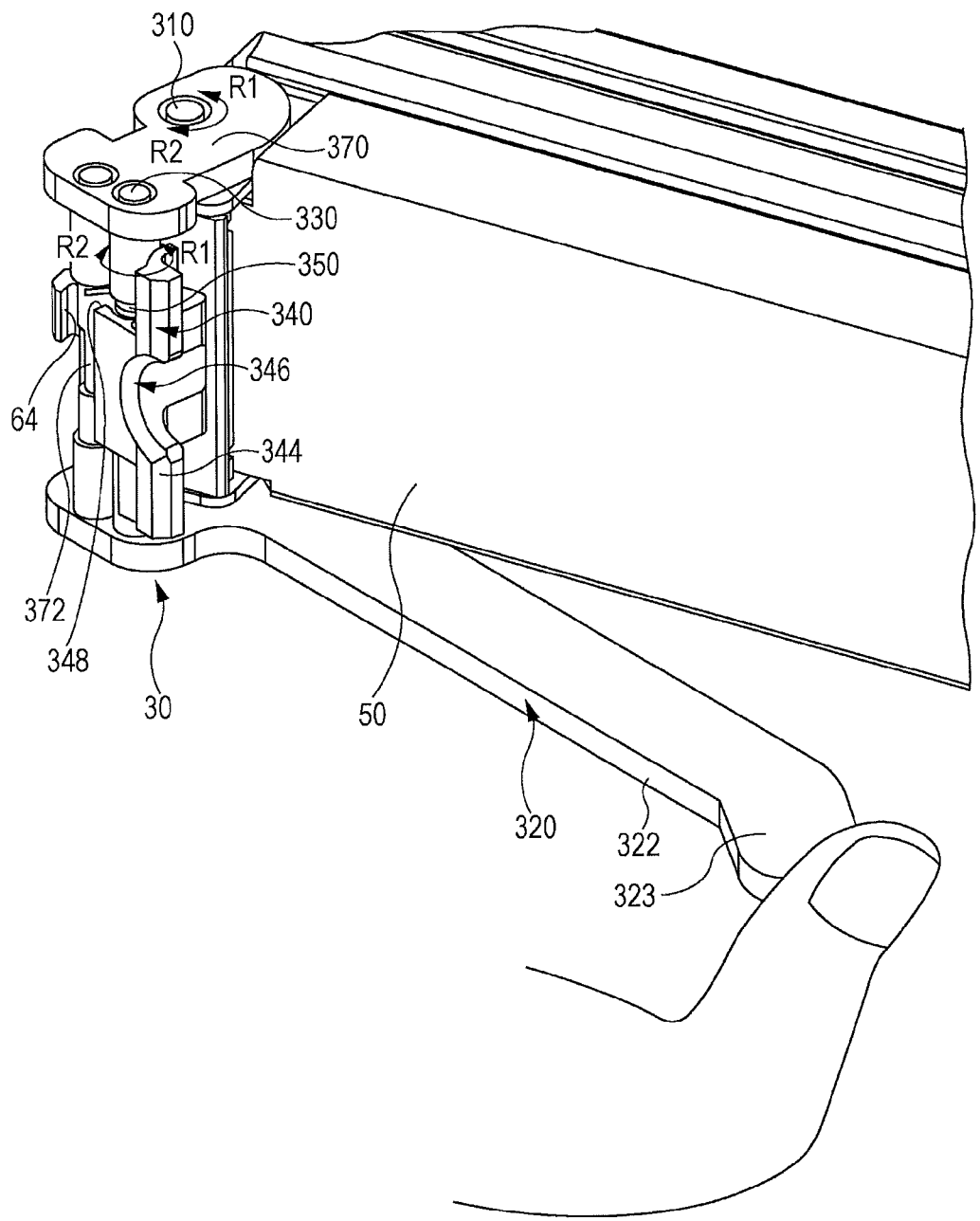
FIG. 11 is a perspective view of an example of an operating state when open operation of the lever member is started.
Figure 12:
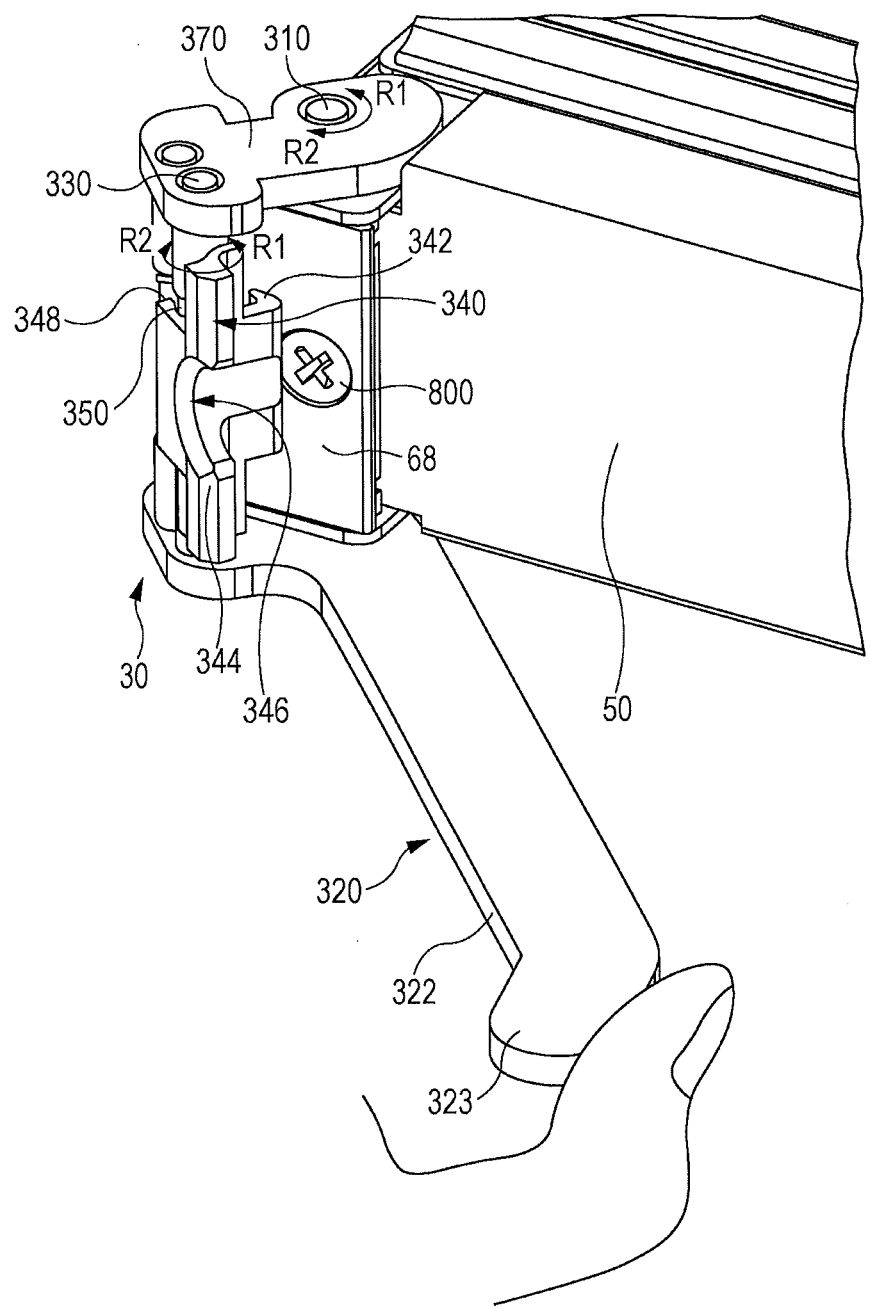
FIG. 12 is a perspective view of the state of the insertion and removal lever before the lever member reaches an open position.
Figure 13:
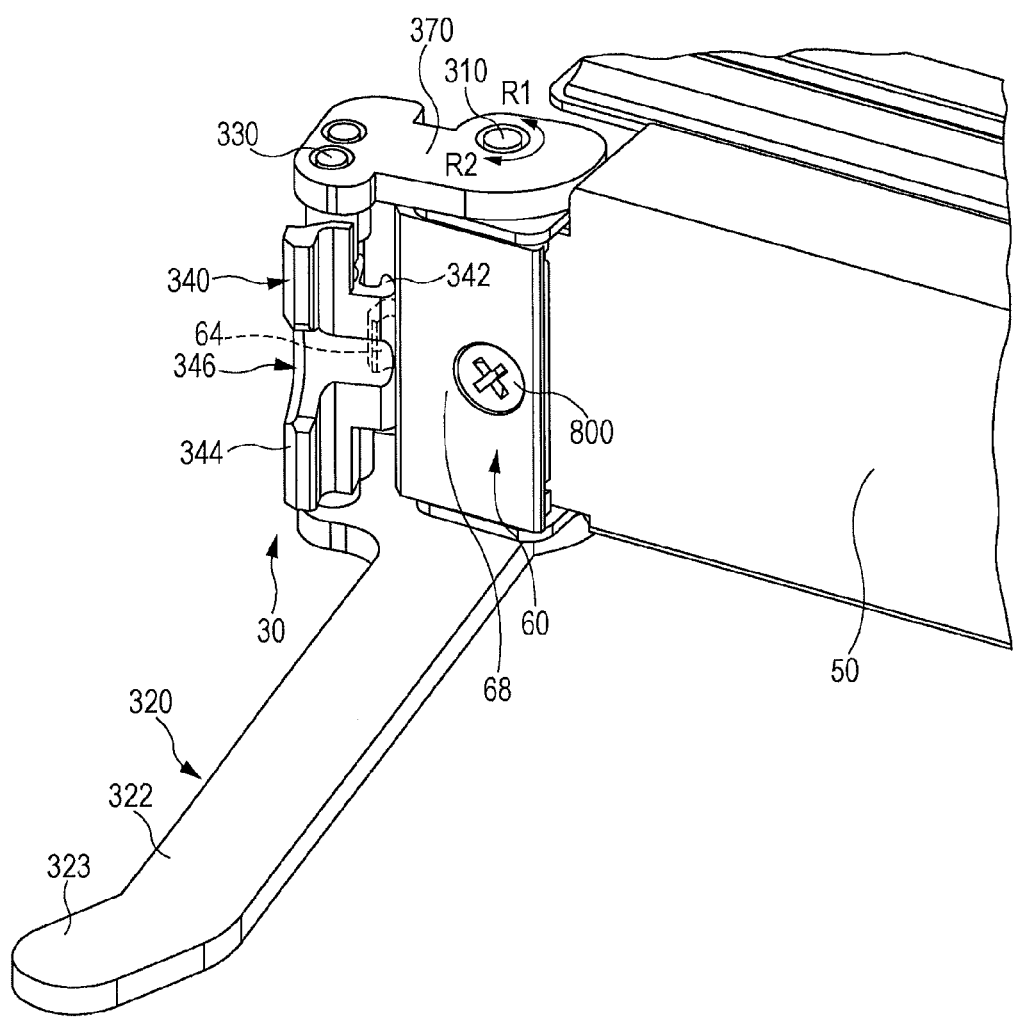
FIG. 13 is a perspective view of the state of the insertion and removal lever when the lever member is in the open position.

FIG. 8 is a perspective view of the state of the insertion and removal lever 30 when the lever member 320 is in the closed position. FIG. 9 is a perspective view of an example of an operating state when the first locked state of the locking member 340 is lifted. FIG. 10 is a perspective view of an example of an operating state when the first locked state is lifted (or immediately after the first locked state is lifted). However, in FIG. 10, the finger which is performing operation is not depicted. FIG. 11 is a perspective view of an example of an operating state when open operation of the lever member 320 is started. FIG. 12 is a perspective view of the state of the insertion and removal lever 30 before the lever member 320 reaches the open position. FIG. 13 is a perspective view of the state of the insertion and removal lever 30 when the lever member 320 is in the open position (at the end of open operation of the lever member 320). In FIGS. 8 to 13, the ports 53 and so forth in the front section 50 are not depicted.

The description below is based on the assumption that, in a state in which the lever member 320 depicted in FIG. 8 is in the closed position (a state in which the electronic circuit unit 1 is completely inserted in the shelf 100), the locking member 340 is in the first locked state (though not seen in FIG. 8, the hook section 342 engages the first locking member receiving section 62) by the urging force (the urging force in a direction of rotation in the first direction R1) generated by the elastic member 350.

When the electronic circuit unit 1 is detached from the state depicted in FIG. 8, as depicted in FIG. 9, the user first pulls the locking member 340 toward the front side (rotates the locking member 340 in the second direction R2) with a finger. As a result of this operation, the locking member 340 is released from the first locked state (the hook section 342 is disengaged from the first locking member receiving section 62), and the locking member 340 rotates about the locking rotating shaft 330 in the second direction R2 against the urging force from the elastic member 350. At this time, when the urging force (the elastic force by the elastic member 350) is relatively great, the lever member 320 rotates in an open direction (the second direction R2) from the closed position with the rotation of the locking member 340. In this description, it is assumed that the urging force (the elastic force of the elastic member 350) is very weak and the lever member 320 does not materially rotate from the closed position in the open direction.

When the user further pulls the locking member 340 toward the front side from the state depicted in FIG. 9 (rotates the locking member 340 in the second direction R2), as depicted in FIG. 10, the contact section 348 of the locking member 340 comes into contact with the force transmission member 372. An angle of rotation (an angle of rotation in the second direction R2) may be arbitrarily set and may be a very small angle, where the angle of rotation is one of the locking member 340 from the first locked state to a position in which the contact section 348 of the locking member 340 comes into contact with the force transmission member 372.

When the user further pulls the locking member 340 toward the front side from the state depicted in FIG. 10 (rotates the locking member 340 in the second direction R2), as schematically indicated with a force F in FIG. 10, a force which is applied to the locking member 340 is transmitted to the lever member 320 via the force transmission member 372. As a result, the rotation moment (the rotation moment that acts in the second direction R2) around the lever shaft 310 acts on the lever member 320, and the lever member 320 rotates (produces first motion) from the closed position in the open direction (the second direction R2) and enters a state depicted in FIG. 11.

In the state depicted in FIG. 11, not only the tip section 323 but also other portions of the lever operation section 322 of the lever member 320 jut out from the front section 50 of the electronic circuit unit main body 10 toward the front side. This allows the user to operate the lever operation section 322 of the lever member 320 with ease. When the state enters the state depicted in FIG. 11, the user ends operation of the locking member 340 and starts operation of the lever member 320 (operation to open the lever member 320) (changes an object to be operated from the locking member 340 to the lever member 320).

When the user releases the finger from the locking member 340 at the end of operation of the locking member 340, the locking member 340 starts to rotate in the first direction R1 because the locking member 340 is urged in the first direction R1 by the urging force from the elastic member 350. At this time, the rotation of the locking member 340 in the first direction R1 may be restricted as a result of the locking member 340 coming into contact with part of the force transmission member 372 (see FIG. 14B and other drawings). Moreover, when the user releases the finger from the locking member 340 at the end of operation of the locking member 340, the locking member 340 rotates in the first direction R1 by the urging force of the elastic member 350, but the locking member 340 does not engage the first locking member receiving section 62 again because the lever member 320 is not in the closed position anymore. This allows the user to hold the lever member 320 after releasing the finger from the locking member 340 (that is, an object to be held may be changed from the locking member 340 to the lever member 320 without holding the locking member 340 with a finger).

When the user pulls the lever operation section 322 of the lever member 320 toward the front side from the state depicted in FIG. 11 (rotates the lever operation section 322 in the second direction R2), after a state depicted in FIG. 12, as depicted in FIG. 13, the lever member 320 rotates about the lever shaft 310 in the second direction R2 to the open position. When the lever member 320 is rotated to the open position, the hook section 342 engages the second locking member receiving section 64 (which is seen through the other component and indicated with dashed lines in FIG. 13), and the second locked state in which further rotation of the lever member 320 in the second direction R2 is restricted is achieved.

When the lever member 320 is rotated from the closed position to the open position in the second direction R2 in this manner, the connector 42 of the electronic circuit unit 1 is disconnected by leverage generated by the lever member 320 during that time and the electronic circuit unit 1 is pulled out toward the front side. The principles will be described with reference to FIGS. 14A to 14C.

Figure 14A:
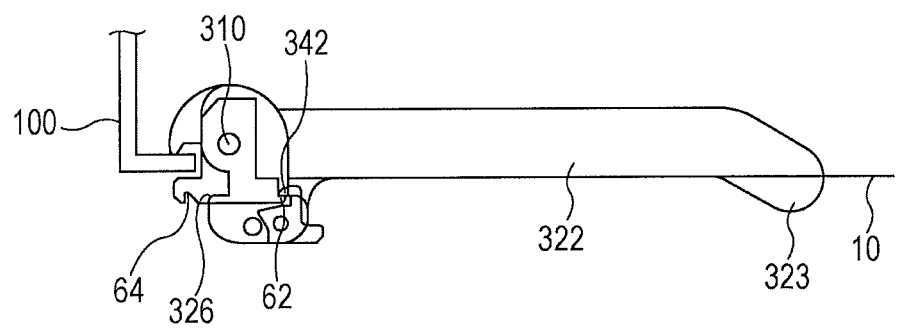
FIG. 14A is a diagram of a state in which the lever member before open operation is in the closed position, the state schematically viewed from above.
Figure 14B:
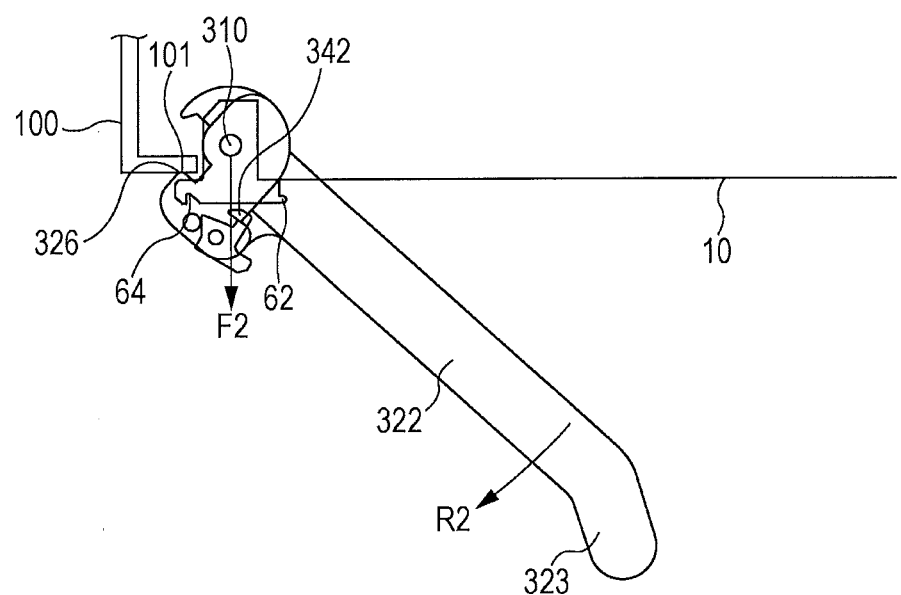
FIG. 14B is a diagram of a state before the lever member during open operation reaches the open position (when the lever member is in a position in which leverage is generated), the state schematically viewed from above.
Figure 14C:
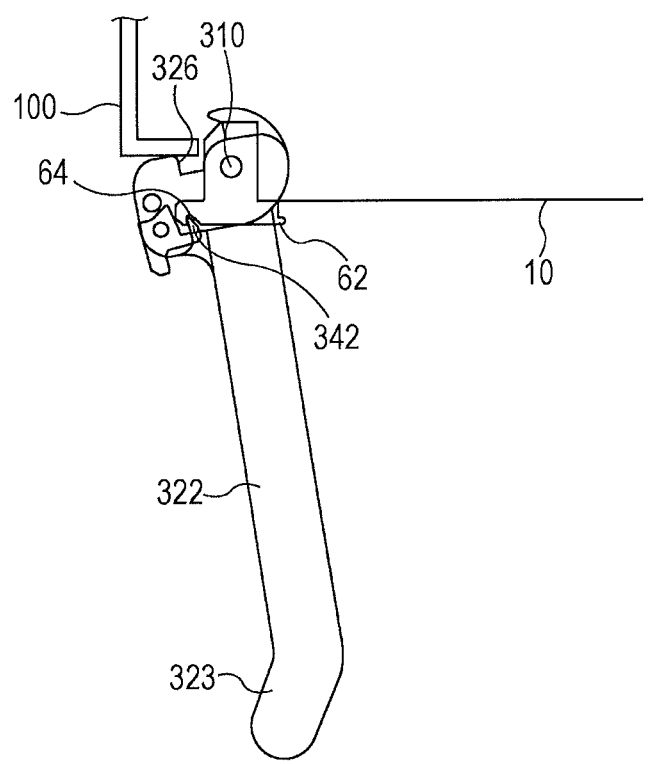
FIG. 14C is a diagram of a state in which the lever member at the end of open operation is in the open position, the state schematically viewed from above.

FIGS. 14A to 14C are explanatory diagrams of the principles of leverage when the lever member 320 is rotated from the closed position to the open position in the second direction R2. FIGS. 14A to 14C schematically depict the positional relationship among the lever member 320, the shelf 100, the electronic circuit unit main body 10, the hook section 342 of the locking member 340, and the second locking member receiving section 64 of the locked member 60 at each stage when the lever member 320 is rotated from the closed position to the open position in the second direction R2. FIG. 14A is a diagram of the above positional relationship when the lever member 320 is in the closed position (at the beginning of open operation), the positional relationship schematically viewed from above. FIG. 14B is a diagram of the above positional relationship before the lever member 320 reaches the open position (when the lever member 320 is in a position in which leverage is generated during open operation), the positional relationship schematically viewed from above. FIG. 14C is a diagram of the above positional relationship when the lever member 320 is in the open position (at the end of open operation), the positional relationship schematically viewed from above.

As described earlier, in a state in which the lever member 320 is in the closed position (a state in which the electronic circuit unit 1 is completely inserted in the shelf 100), as depicted in FIG. 14A, the locking member 340 is in a state in which the hook section 342 engages the first locking member receiving section 62 (the first locked state). Moreover, the connector 42 of the electronic circuit unit 1 is in a fitted state in which the connector 42 is fitted into the connector (which is not depicted) on the backboard.

When the locking member 340 is pulled toward the front side in the manner described above from the state depicted in FIG. 14A, the lever member 320 juts out toward the front side. When the lever member 320 is then rotated to the open position in the second direction R2 by user operation, as depicted in FIG. 14B, the second contact section 326 of the lever member 320 makes contact with a part 101 (in an example depicted in FIG. 14B, a part located on the front side) of the shelf 100. Therefore, when a force that rotates the lever member 320 in the second direction R2 is applied to the lever member 320 in this state, leverage acts on the lever shaft 310 with the second contact section 326 serving as a fulcrum, the lever shaft 310 serving as a point of application, and the lever operation section 322 serving as a point of effort. This leverage generates a force F2 that pulls the electronic circuit unit main body 10 toward the front side and pulls the electronic circuit unit 1 toward the front side of the shelf 100 while lifting the fitted state in which the connector 42 is fitted into the connector on the backboard of the shelf 100. That is, the force F2 which is equal to or greater than the force that fits the connectors together is generated by a lever ratio, whereby the fitted state of the connector 42 is lifted, and at the same time the electronic circuit unit 1 is pulled out toward the front side of the shelf 100.

When the lever member 320 is rotated to the open position from the state depicted in FIG. 14B, as depicted in FIG. 14C, the electronic circuit unit 1 is further pulled out toward the front side of the shelf 100, and the state enters a state in which the electronic circuit unit 1 is detachable from the shelf 100. Incidentally, after the fitted state of the connector 42 is completely lifted, the electronic circuit unit 1 is brought to a state in which the electronic circuit unit 1 is detachable from the shelf 100. Therefore, the state only has to enter a state in which the electronic circuit unit 1 is detachable before the lever member 320 is rotated to the open position. Incidentally, as depicted in FIG. 14C, when the lever member 320 is rotated to the open position, the hook section 342 engages the second locking member receiving section 64, and the second locked state is achieved.

On the other hand, when the lever member 320 is rotated from the open position to the closed position in the first direction R1, the connector 42 of the electronic circuit unit 1 is fitted into the connector (which is not depicted) on the backboard of the shelf 100 by leverage generated by the lever member 320 during that time, and the electronic circuit unit 1 is pushed into the shelf 100 toward the depth side thereof. The principles will be described with reference to FIGS. 15A to 15C.

Figure 15A:
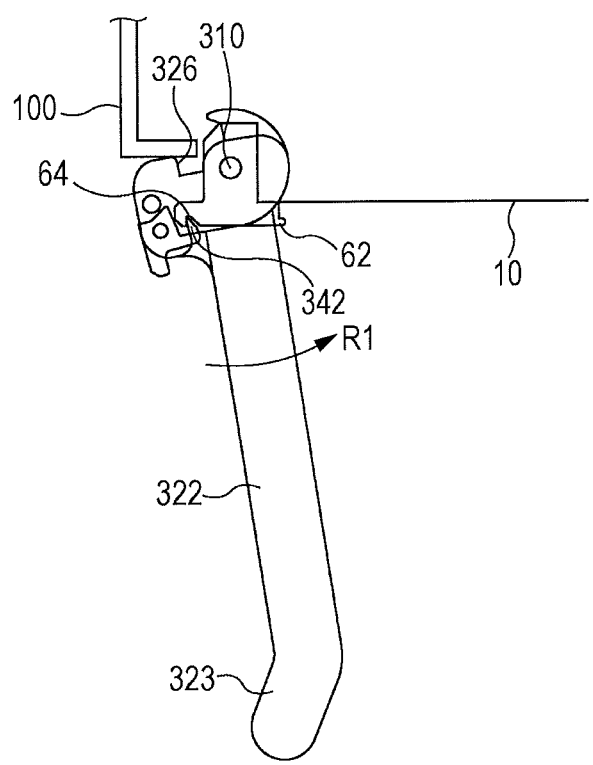
FIG. 15A is a diagram of a state in which the lever member before closing operation is in the open position, the state schematically viewed from above.
Figure 15B:
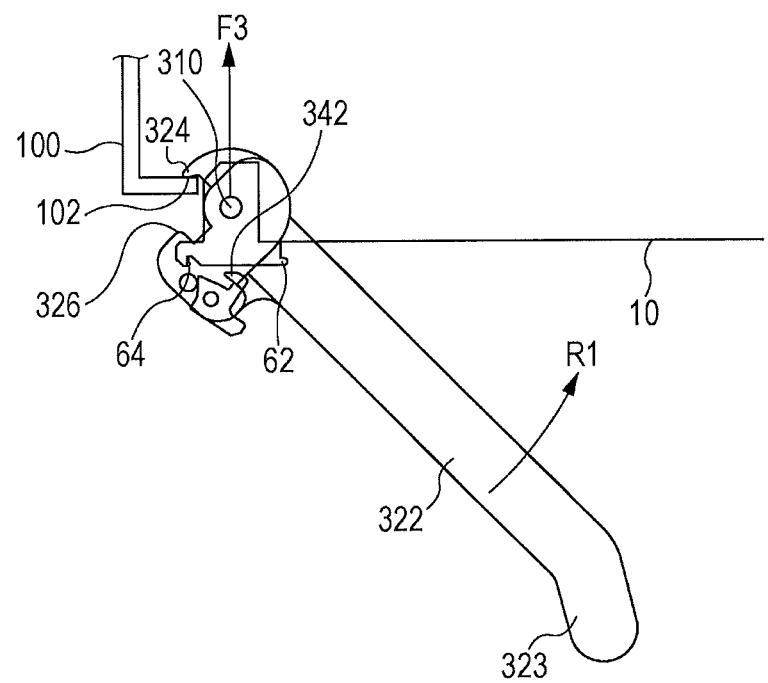
FIG. 15B is a diagram of a state before the lever member during closing operation reaches the closed position (the lever member is in a position in which leverage is generated), the state schematically viewed from above.
Figure 15C:
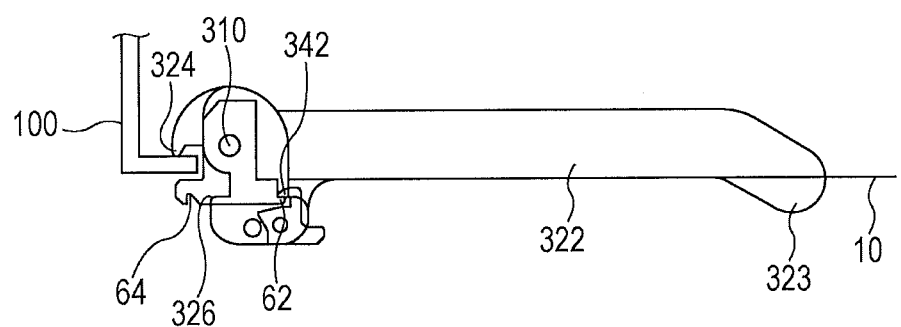
FIG. 15C is a diagram of a state in which the lever member at the end of closing operation is in the closed position, the state schematically viewed from above.

FIGS. 15A to 15C are explanatory diagrams of the principles of leverage when the lever member 320 is rotated from the open position to the closed position in the first direction R1. FIGS. 15A to 15C schematically depict the positional relationship among the lever member 320, the shelf 100, the electronic circuit unit main body 10, the hook section 342 of the locking member 340, and the first locking member receiving section 62 of the locked member 60 at each stage when the lever member 320 is rotated from the open position to the closed position in the first direction R1. FIG. 15A is a diagram of the above positional relationship when the lever member 320 is in the open position (at the beginning of closing operation), the positional relationship schematically viewed from above. FIG. 15B is a diagram of the above positional relationship before the lever member 320 reaches the closed position (when the lever member 320 is in a position in which leverage is generated during closing operation), the positional relationship schematically viewed from above. FIG. 15C is a diagram of the above positional relationship when the lever member 320 is in the closed position (at the end of closing operation), the positional relationship schematically viewed from above.

Operation to rotate the lever member 320 from the open position to the closed position in the first direction R1 may be performed after the electronic circuit unit 1 is inserted into the shelf 100 to a certain extent (until the connector 42 of the electronic circuit unit 1 comes into contact with the connector on the backboard of the shelf 100). Incidentally, as described earlier, in a state in which the lever member 320 is in the open position, as depicted in FIG. 15A, the locking member 340 is in a state in which the hook section 342 engages the second locking member receiving section 64 (the second locked state), but the lever member 320 is allowed to rotate in the first direction R1.

When the lever member 320 is rotated to the closed position in the first direction R1 by user operation from the state depicted in FIG. 15A, as depicted in FIG. 15B, the first contact section 324 of the lever member 320 makes contact with a part 102 (in an example depicted in FIG. 15B, a part located on the depth side) of the shelf 100. Therefore, when a force that rotates the lever member 320 in the first direction R1 is applied to the lever member 320 in this state, leverage acts on the lever shaft 310 with the first contact section 324 serving as a fulcrum, the lever shaft 310 serving as a point of application, and the lever operation section 322 serving as a point of effort. This leverage generates a force F3 that pushes the electronic circuit unit main body 10 toward the depth side and pushes the electronic circuit unit 1 toward the depth side of the shelf 100 while making the connector 42 start to fit into the connector on the backboard of the shelf 100. That is, the force F3 that fits the connectors together is generated by a lever ratio, whereby the fitted state of the connector 42 is produced, and at the same time the electronic circuit unit 1 is pushed toward the depth side of the shelf 100.

When the lever member 320 is rotated to the closed position from the state depicted in FIG. 15B, as depicted in FIG. 15C, the electronic circuit unit 1 is further pushed toward the depth side of the shelf 100, the connector 42 is brought to a fitted state, and the electronic circuit unit 1 is fixed to the shelf 100 (that is, insertion is completed). At this time, as a result of the hook section 342 engaging the depth side of the first locking member receiving section 62 after getting over the first locking member receiving section 62, the first locked state is achieved. As described above, when operation to insert the electronic circuit unit 1 into the shelf 100 is performed, it is not desired that the user operate the locking member 340 directly.

Incidentally, when the lever operation section 322 is rotated to the closed position, as described earlier, the lever operation section 322 is housed (pushed) more on the depth side than the front section 50 of the electronic circuit unit main body 10 except for the tip section 323. On the other hand, since the tip section 323 of the lever operation section 322 bends toward the front side, as depicted in FIG. 15C, the tip section 323 slightly juts out from the front section 50 of the electronic circuit unit main body 10 toward the front side. Therefore, due to, for example, component tolerances and so forth, even when the first locked state is not achieved even after the lever operation section 322 is pushed and located more on the depth side than the front section 50 (or even when the connector 42 is not brought to a fitted state), it is possible to achieve the first locked state (and the fitted state of the connector 42) reliably by further pushing the tip section 323 of the lever operation section 322.

The above-described method of operation of the insertion and removal lever 30 when the electronic circuit unit 1 is inserted and removed provides a high degree of ease of use and is very easy for the user to understand. For example, when the user desires to detach a certain electronic circuit unit 1 from the shelf 100, the user first pulls the locking member 340 related to the electronic circuit unit 1 toward the front side and rotates the lever member 320 jutting out toward the front side by the above operation to the open position, whereby the user is allowed to detach the electronic circuit unit 1 from the shelf 100. In so doing, the user is allowed to change an object to be held with a hand from the locking member 340 to the lever member 320 by holding the lever member 320 after releasing the hand from the locking member 340 (that is, an object to be held may be changed from the locking member 340 to the lever member 320 without holding the locking member 340). Specifically, after the lever member 320 is slightly rotated from the closed position in the second direction R2, the locking member 340 does not engage the first locking member receiving section 62 again even when the user releases the hand from the locking member 340 unless the lever member 320 is pushed to the closed position again by user operation (that is, although the locking member 340 is rotated in the first direction R1 by the urging force of the elastic member 350, the locking member 340 does not engage the first locking member receiving section 62 again because the lever member 320 is already rotated from the closed position).

Moreover, when the user desires to detach a certain electronic circuit unit 1 from the shelf 100, the user first pulls the locking member 340 related to the electronic circuit unit 1 toward the front side, whereby the lever member 320 juts out toward the front side (see FIG. 11). This allows the user to understand easily that it is possible to detach the electronic circuit unit 1 from the shelf 100 by pulling the jutting lever member 320 toward the front side (rotating the lever member 320 to the open position). Specifically, as is clear from FIG. 1, in a structure in which the lever member 320 is disposed on that side of the electronic circuit unit 1 where the lower surface or the top surface is located (in the example depicted in FIG. 1, a structure in which the lever member 320 is located on that side of the electronic circuit unit 1 where the lower surface is located), when a plurality of electronic circuit units 1 depicted in FIG. 1 are stacked, it is difficult to determine which lever member 320 corresponds to which electronic circuit unit 1. On the other hand, since each locking member 340 is provided in such a way as to occupy the middle position of a corresponding electronic circuit unit main body 10 in a vertical direction, it is easy to determine which locking member 340 corresponds to which electronic circuit unit 1. This makes it possible to keep effectively the user from erroneously trying to detach an unintended electronic circuit unit 1.

Although the embodiment has been described in detail, the embodiment is not limited to a particular embodiment, and the various modifications and changes could be made hereto within the scope of the appended claims. Moreover, all or more than one of the component elements of the above-described embodiment may be combined.

For example, in the embodiment described above, the lever member 320 is provided with the first and second contact sections 324 and 326 that serve as fulcrums when leverage is generated, but the upper plate 370 may be provided with similar first and second contact sections that serve as fulcrums when leverage is generated. In this case, both the lever member 320 and the upper plate 370 may be provided with the first and second contact sections, or any one of the lever member 320 and the upper plate 370 may be provided with the first and second contact sections. Alternatively, the upper plate 370 and the lever member 320 may be provided with the first and second contact sections 324 and 326, respectively, or the lever member 320 and the upper plate 370 may be provided with the first and second contact sections 324 and 326, respectively. In any of these cases, since the upper plate 370 with at least any one of the first and second contact sections 324 and 326 functions practically as an integral part of the lever member 320, the upper plate 370 is an element of the lever member 320. As described above, the lever operation section 322 and the first and second contact sections 324 and 326 which form the lever member 320 may be provided in the same component element or may be provided separately in two or more component elements that operate in an integrated fashion.

Moreover, in the embodiment described above, the force transmission member 372 is provided, but the force transmission member 372 may be omitted as described above. In this case, the rotation of the locking member 340 in the first direction R1 may be restricted as a result of the hook section 342 making contact with the front face 68 of the locked member 60 in place of the force transmission member 372 during open and closing operation of the lever member 320.

In this case, when the lever member 320 is opened to a position just before the open position, the restriction imposed by the front face 68 of the locked member 60 is lifted, and the locking member 340 rotates in the first direction R1. As a result, the hook section 342 engages the second locking member receiving section 64, and the second locked state is achieved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An electronic circuit unit comprising:
    an electronic circuit unit main body that is housed in a shelf, the electronic circuit unit main body being inserted in the shelf;
    a first rotating shaft that is provided on a front side of the electronic circuit unit main body in a viewpoint of a direction in which the electronic circuit unit main body is inserted;
    a lever member that is rotatably provided about the first rotating shaft, the lever member urging the electronic circuit unit main body toward a depth side of the shelf by a principle of leverage by making contact with part of the shelf when the lever member is rotated in a first direction about the first rotating shaft and urging the electronic circuit unit main body toward a front side of the shelf by the principle of leverage by making contact with another part of the shelf when the lever member is rotated in a second direction about the first rotating shaft, the second direction being opposite to the first direction;
    a second rotating shaft that is provided in the lever member and extends parallel to the first rotating shaft;
    a locking member that is rotatably provided about the second rotating shaft, the locking member locking the lever member in such a way that rotation of the lever member in the second direction about the first rotating shaft is disabled in a state in which insertion of the electronic circuit unit main body into the shelf is completed, the locking member contacting a force transmission member causing the force transmission member to apply a force to the lever member that rotates the lever member in the second direction about the first rotating shaft while lifting a locked state of the lever member when the locking member is rotated in a second direction about the second rotating shaft in the locked state of the lever member; and
    an elastic member provided around the second rotating shaft, one end of the elastic member is held by the force transmission member and another end of the elastic member is held by the locking member, wherein
        the elastic member urges the locking member to rotate in a first direction about the second rotating shaft,
        an elastic force is transmitted between the lever member and the locking member, and
        the force transmission member is fixed to the lever member and extends in a vertical direction parallel to the second rotating shaft.

2. The electronic circuit unit according to claim 1, wherein
the locking member is provided in a height range between a top surface and a lower surface of the electronic circuit unit main body.

3. The electronic circuit unit according to claim 1, wherein
the locking member is provided in such a way as to occupy a middle position of the electronic circuit unit main body in a vertical direction.

4. The electronic circuit unit according to claim 1, wherein
the first rotating shaft, the second rotating shaft, and the locking member are disposed at ends of the electronic circuit unit main body in a width direction on the front side thereof.

5. The electronic circuit unit according to claim 1, further comprising:
a first locking member receiving section that is provided in the electronic circuit unit main body, the first locking member receiving section that disables rotation of the lever member in the second direction about the first rotating shaft by engaging the locking member that rotates in the first direction about the second rotating shaft by an urging force of the elastic member when the lever member is rotated to a closed position in the first direction about the first rotating shaft; and
a second locking member receiving section that is provided in the electronic circuit unit main body, the second locking member receiving section that disables further rotation of the lever member in the second direction about the first rotating shaft by engaging the locking member that rotates in the first direction about the second rotating shaft by the urging force of the elastic member when the lever member is rotated to an open position in the second direction about the first rotating shaft.

6. The electronic circuit unit according to claim 1, further comprising:
a first locking member receiving section that is provided in the electronic circuit unit main body, the first locking member receiving section that disables rotation of the lever member in the second direction about the first rotating shaft by engaging the locking member when the lever member is rotated to a closed position in the first direction about the first rotating shaft; wherein
the lever member includes a lever operation section that extends from the first rotating shaft in a longitudinal direction,
the lever member rotates in a plane parallel to a top surface or a lower surface of a front section of the electronic circuit unit main body, the front section that extends toward the front side of the electronic circuit unit main body, the plane located above the top surface of the front section of the electronic circuit unit main body or below the lower surface of the front section of the electronic circuit unit main body, and
when the lever member is in the closed position, the lever operation section is located more on a depth side than the front section of the electronic circuit unit main body except for a tip section.

7. The electronic circuit unit according to claim 1, wherein
the locking member includes an operation section with a notch.

8. A communication device comprising:
a plurality of electronic circuit units; and
a shelf;
wherein one of the plurality of electronic circuit units comprises:
an electronic circuit unit main body that is housed in the shelf, the electronic circuit unit main body being inserted in the shelf;
a first rotating shaft that is provided on a front side of the electronic circuit unit main body in a viewpoint of a direction in which the electronic circuit unit main body is inserted;
a lever member that is rotatably provided about the first rotating shaft, the lever member that urges the electronic circuit unit main body toward a depth side of the shelf by principles of leverage by making contact with part of the shelf when the lever member is rotated in a first direction about the first rotating shaft and urges the electronic circuit unit main body toward a front side of the shelf by the principles of leverage by making contact with another part of the shelf when the lever member is rotated in a second direction about the first rotating shaft, the second direction opposite to the first direction;
a second rotating shaft that is provided in the lever member and extends parallel to the first rotating shaft;
a locking member that is rotatably provided about the second rotating shaft, the locking member that locks the lever member in such a way that rotation of the lever member in the second direction about the first rotating shaft is disabled in a state in which insertion of the electronic circuit unit main body into the shelf is completed, the locking member contacting a force transmission member causing the force transmission member to apply a force to the lever member that rotates the lever member in the second direction about the first rotating shaft while releasing a lock on the lever member when the locking member is rotated in a second direction about the second rotating shaft in a locked state of the lever member;
an elastic member provided around the second rotating shaft, one end of the elastic member is held by the force transmission member and another end of the elastic member is held by the locking member, wherein
the elastic member urges the locking member to rotate in a first direction about the second rotating shaft,
an elastic force is transmitted between the lever member and the locking member, and
the force transmission member is fixed to the lever member and extends in a vertical direction parallel to the second rotating shaft.

* * * * *